United States Patent
Chew et al.

(10) Patent No.: US 11,836,345 B2
(45) Date of Patent: *Dec. 5, 2023

(54) MEMORY ELEMENT PROFILING AND OPERATIONAL ADJUSTMENTS

(71) Applicant: Micron Technology, Inc., Boise, ID (US)

(72) Inventors: Francis Chew, Boulder, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 54 days.

This patent is subject to a terminal disclaimer.

(21) Appl. No.: 17/151,070

(22) Filed: Jan. 15, 2021

(65) Prior Publication Data

US 2021/0141533 A1  May 13, 2021

Related U.S. Application Data (63) Continuation of application No. 16/182,399, filed on Nov. 6, 2018, now Pat. No. 10,895,983.

(51) Int. Cl.
*G06F 3/06* (2006.01)

(52) U.S. Cl.
CPC .......... *G06F 3/0604* (2013.01); *G06F 3/0653* (2013.01); *G06F 3/0679* (2013.01)

(58) Field of Classification Search
CPC .... G06F 3/0604; G06F 3/0653; G06F 3/0679; G06F 12/0246
See application file for complete search history.

(56) References Cited

U.S. PATENT DOCUMENTS 10,452,480 B2  10/2019  Koudele et al.
10,726,934 B2  7/2020  Chew et al.
(Continued)

FOREIGN PATENT DOCUMENTS

CN  101794198 A  8/2010
CN  102272737 A  12/2011
CN  108269603 A  7/2018

OTHER PUBLICATIONS

CN Patent Application No. 201911076966.2—Chinese Office Action and Search Report, dated Mar. 27, 2023, with English Translation, 12 pages.

*Primary Examiner* — Tasnima Matin
(74) *Attorney, Agent, or Firm* — Perkins Coie LLP (57) ABSTRACT

A memory profiling system can generate profiles for target memory units of a memory component during runtime of the memory component. The memory profiling system can identify target memory units based on trigger conditions such as memory units crossing a specified depth in error recovery, receipt of a vendor specific (VS) command, memory unit retirement, or excessive background scan rates. In some cases, the memory profiling system can identify additional target memory units that are related to identified target memory units. The characterization processes can include computing voltage threshold (vt) distributions, Auto Read Calibration (ARC) analysis, Continuous Read Level Calibration (cRLC) analysis, DiffEC metrics, or gathering memory component metrics. The memory profiling system can store the generated profiles and can utilize the generated profiles to adjust operating parameters of one or more memory elements of the memory device, in real time.

20 Claims, 7 Drawing Sheets

(56) References Cited

U.S. PATENT DOCUMENTS

| | | |
|---|---|---|
| 2010/0174849 A1 | 7/2010 | Walston et al. |
| 2010/0180150 A1 | 7/2010 | Jeddeloh |
| 2010/0262857 A1* | 10/2010 | Enarson ................ G06F 11/073 |
| | | 714/48 |
| 2013/0232289 A1* | 9/2013 | Zhong ................ G06F 12/0246 |
| | | 711/102 |
| 2015/0154111 A1* | 6/2015 | D'Abreu ............ G06F 12/0246 |
| | | 714/6.11 |
| 2018/0188991 A1 | 7/2018 | Dash et al. |
| 2019/0102097 A1* | 4/2019 | Madraswala ......... G06F 3/0679 |
| 2019/0304550 A1* | 10/2019 | Shen .................. G11C 16/3418 |
| 2019/0355426 A1* | 11/2019 | Sheperek ............. G11C 29/021 |
| 2020/0142590 A1 | 5/2020 | Chew et al. |

* cited by examiner

MEMORY ELEMENT PROFILING AND OPERATIONAL ADJUSTMENTS

CROSS-REFERENCE TO RELATED APPLICATIONS

This application is a continuation of U.S. application Ser. No. 16/182,399, filed Nov. 5, 2018; which is incorporated herein by reference in its entirety.

TECHNICAL FIELD

The present disclosure generally relates to a memory sub-system, and more specifically, relates to identifying memory elements to profile for logging or adjusting corresponding operating parameters.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to identifying elements of a memory sub-system, during runtime; profiling the identified memory elements; and logging the profiles or making operational adjustments based on the profiles. A memory sub-system is also hereinafter referred to as a "memory device". An example of a memory sub-system is a storage system, such as a solid-state drive (SSD). In some embodiments, the memory sub-system is a hybrid memory/storage sub-system. In various implementations, a memory sub-system can include non-volatile memory components, such as, for example, negative-and (NAND). In general, a host system can utilize a memory sub-system that includes one or more memory components, which can be made of memory units, such as pages, blocks, planes, die, or groups thereof. While the technologies described herein generally refer to profiling memory units, in various implementations, the technologies can be used to identify and profile memory elements at different granularities such as memory units (e.g. pages, blocks, planes, die, etc.), whole memory components (e.g. NAND components), whole memory devices (e.g. SSDs), or groups of memory devices The host system can provide data to be stored at the memory sub-system and can request data to be retrieved from the memory sub-system.

A memory profiling system can identify target memory units (e.g. pages, blocks, etc.) of a memory component to characterize, perform a characterization process, and store the characterization results or use the characterization results to implement automatic actions. Identifying target memory units can be accomplished by selecting a memory unit that meets a trigger condition, such as: pages crossing a specified depth in error recovery, receipt of a vendor specific (VS) command, block retirement, or excessive background scan folding rate. The characterization processes can include voltage threshold (vt) distributions, Auto Read Calibration (ARC) analysis, Continuous Read Level Calibration (cRLC) analysis, Difference in Bit Error Counts (DiffEC) metrics, or obtaining memory metrics (e.g. erase count, associated memory unit temperature, read count, power on hours, etc.).

Current media characterization systems rely on collecting limited data after a failure event. The gathered data can be incomplete due to factors such as a considerable time lapse, the memory device has experienced one or more power cycles, or different configuration parameters having been applied to the memory device. Furthermore, the data gathering may be only initiated in limited circumstances, such as only after catastrophic failures or when a logging test suite is run. For example, when an error recovery procedure reaches certain levels, the data can be moved and the memory unit can be retired. This may not trigger a data gathering procedure. However, for security reasons, the retired memory unit can be erased. When a later data gathering procedure is performed, information about the retired memory unit is incomplete, yet the missing data could have helped identify the cause of the failure. Furthermore, due to the incomplete nature of the data and due to the delay in obtaining it, the data provides a poor key for mapping to corrective measures and fails to achieve such corrective measures during operation of the memory device, when they would be most effective.

Aspects of the present disclosure address the above and other deficiencies by identifying a wider range of profiling triggers, which cause selection of particular associated memory elements for profiling. This generates more prolific data, resulting in more accurate memory element profiles. The present disclosure further addresses these deficiencies by performing the data gathering immediately after a triggering event, e.g. during the runtime of the memory device, which prevents loss of data necessary for accurate profiling and allows corrective actions to be taken when they will be most effective. For example, in the above memory unit retirement example, a trigger can be when the level of error recovery is reach that will cause memory unit retirement.

The memory unit can be profiled and the profile can be saved before the memory unit is erased. This safely disposes of the memory unit while retaining profile information that can help identify the cause of the failure.

Figure 1:
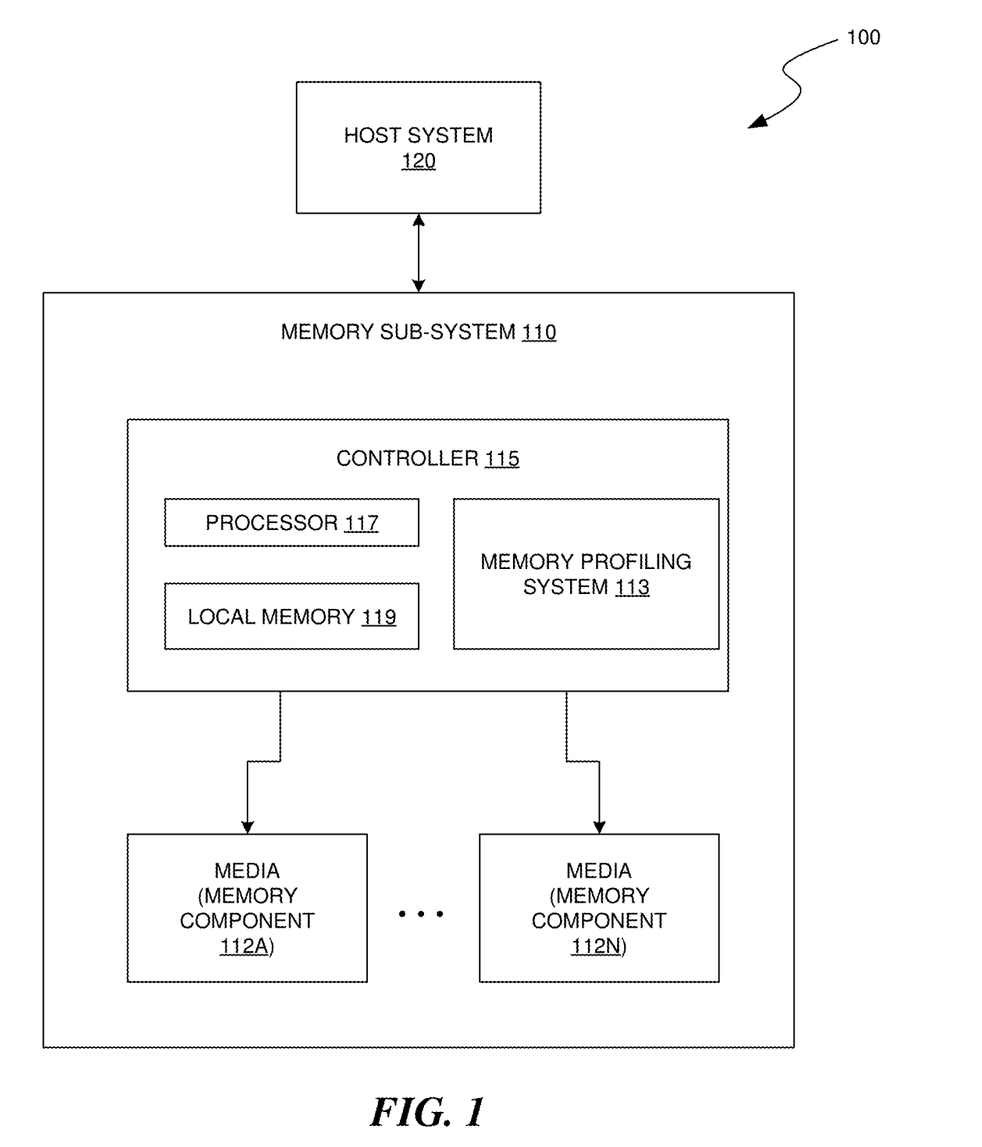
FIG. 1 illustrates an example computing environment that includes a memory sub-system, in accordance with some embodiments of the present disclosure.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both a SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a memory profiling system 113 that can be used to identify, in a memory component, target memory units corresponding to a trigger or to another target memory unit and profile the target memory units during the runtime of the memory device. In some embodiments, the controller 115 includes at least a portion of the memory profiling system 113. For example, the controller 115 can include a processor 117 (processing device) configured to execute instructions stored in local memory 119 for performing the operations described herein. In some embodiments, the memory profiling system 113 is part of the host system 110, an application, or an operating system.

The memory profiling system 113 can identify a trigger condition such as pages crossing a specified level of error recovery, receipt of a vendor specific (VS) command, block retirement, or excessive background scan rate. Memory profiling system 113 can then determine one or more target memory units that correspond to the trigger condition, e.g. the pages that entered error recovery, memory elements identified in the VS command, the block that was retired, or that had the excessive folding rate. In some implementations, the target memory units can include both the memory units associated with the trigger condition and memory units near the associated memory units. The memory profiling system 113 can then profile the target memory units, using e.g. voltage threshold (vt) distributions, Auto Read Calibration (ARC) analysis, Continuous Read Level Calibration (cRLC) analysis, DiffEC metrics, or by obtaining metrics for the target memory units, such as operation counts, temperatures, time powered on, etc. The memory profiling system 113 can store the profile for later analysis (either alone or in aggregate with other profiles) or can use the profile as a key in a mapping to failure causes and/or corrective measures that correspond to that profile type. Where a mapping has aspects that, when selected, the mapping provides corresponding results, the aspects are referred to as the mapping "key." Further details with regards to the operations of the memory profiling system 113 are described below.

Figure 2:
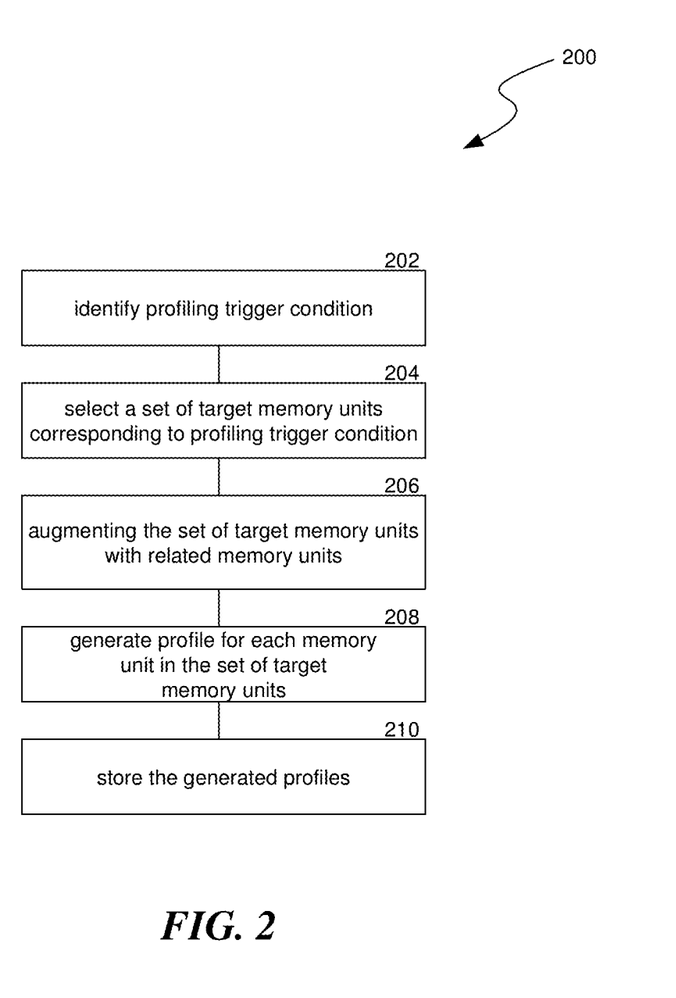
FIG. 2 is a flow diagram of identifying a set of memory units to profile, during runtime, for logging or for operating parameter adjustments, in accordance with some embodiments of the present disclosure.

FIG. 2 is a flow diagram of method 200 for identifying a set of memory elements to profile, during runtime, for logging or for operating parameter adjustments, in accordance with some implementations of the present technology. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the memory profiling system 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 202, the processing logic can identify a trigger condition signifying an opportunity for profiling one or more memory units of a memory component. In various implementations, method can identify a trigger condition when a memory unit enters error recovery, when error recovery includes a sequence of multiple stages and a specified stage in the error recovery sequence is reached, upon receiving a VS command, when a memory unit has been identified for retirement, or when a dynamically configured trigger for background scans (e.g. a timer or I/O event limit) is set below a threshold. Method 200 can be used to identify memory elements at different granularities such as memory units (e.g. pages, blocks, planes, die, etc.), whole memory components (e.g. NAND components), or whole memory devices (e.g. SSDs). For example, one trigger condition can occur when a page enters a particular stage of error recovery while another trigger condition can occur when a block has been identified for retirement.

In existing systems, pages that reach certain depths in the error recovery sequence may be recoverable and operation continues without profiling. However, without data as to the conditions of the memory unit gathered when the error occurred, it can be impossible to track error statistics, much less to determine a likely cause for groups of similar types of errors. Profiling as a result of reaching certain error recovery stages can provide the necessary data to implement such tracking and identify causal relationships. For example, entering an error recovery stage requiring RAID recovery signifies a significant failure. Obtaining profiling information for this type of error can be used to identify common causes or operating condition in which this type error occurs, which can be mapped to corrective measures to avoid this costly error correction procedure.

Profile triggering resulting from a VS command further provides access to previously unavailable information. This provides a user or another application the ability to dynamically obtain data for any memory elements specified in the VS command, not just those that have failed. For example, tests can be performed and profiles for all the memory units in a particular area of a memory component or device or samples from across memory components or devices can be obtained.

Profile triggering can also result from aspects of memory background scanning. Background scanning can begin by reading a memory unit. During a background scan, the memory unit is decoded. The background scan can determine a quality measure for that memory unit by tracking the number of bit corrections needed by the by the error-correcting code (ECC) engine. In some implementations, profile triggering can occur for any memory units with a quality measure below a threshold. In some implementations, certain quality measures can cause the background scanning procedure to perform a refresh relocation event for the memory unit (e.g. moving the data to another memory unit and erasing the original memory unit, and in some cases retiring the original memory unit from use). In some implementations, such refresh relocation events can also trigger profiling. In some implementations, the rate (within a particular area and/or within a particular time period) at which memory units are selected for refresh relocation events can be tracked. This rate reaching a threshold can be another profile triggering event. In some implementations, the rate at which background scans occur can be dynamic, occurring in response to one or both of a dynamic timer threshold or reaching a dynamic I/O event limit. These background scan triggers can be set based on data gathered from previous background scans, other I/O operations, test procedures, etc. In some implementations, the system setting one of the dynamic background scan triggers above a threshold can be a profiling trigger.

At block 204, the processing logic can select, as a target memory unit, one or more memory units corresponding to the trigger condition of block 202. For a profile trigger event resulting from a memory unit entering error recovery or reaching a particular stage in error recovery, the target memory unit can be the memory unit that entered error recovery. For a profile trigger event resulting from receiving a VS command, the target memory units can be one or more memory units identified by the VS command. For a profile trigger event resulting from a memory unit being identified for retirement, the target memory unit can be the memory unit identified for retirement. For a profiling trigger based on specifics of background scans, the target memory units can be a memory unit selected for a refresh relocation event, a memory unit selected for retirement, a set of one or more memory units involved in identifying a rate of refresh relocation events, a set of one or more memory units involved in causing the change in background scanning frequency, or a set of memory units most recently scanned (either within a time period within a particular number of background scans). In some implementations, other target memory elements can be identified, e.g. at a higher granularity than memory units directly associated with the profiling trigger. For example, the processing logic can select the block that contains the page for which error recovery was initiated. As another example, the target memory components can be a memory unit at a lower granularity. For example, the processing logic can select all or a sub-set the pages in a block for which background scanning triggered a refresh relocation event. A selected sub-set, for example, can be a randomly selected sub-set, an evenly distributed sub-set, etc.

Figure 3:
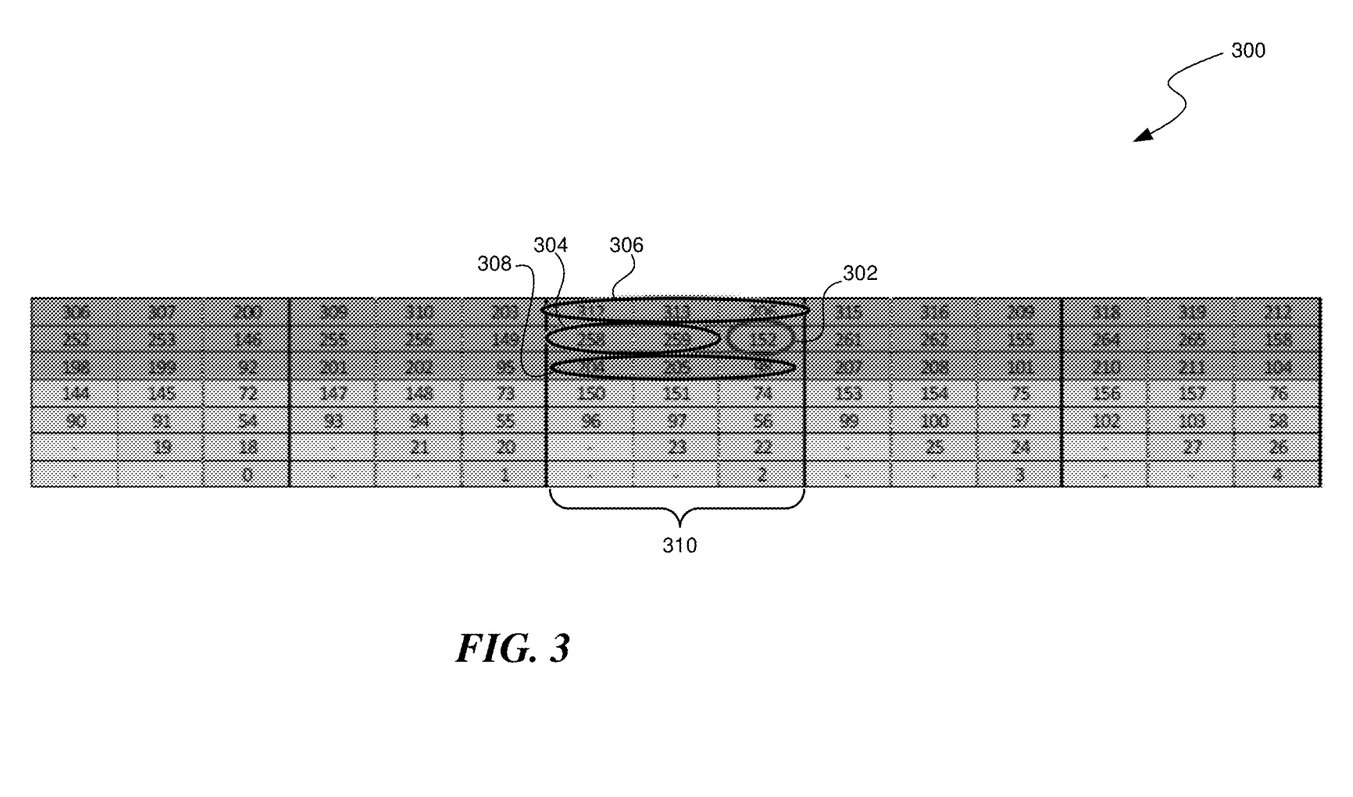
FIG. 3 is a conceptual diagram of selecting additional memory units related to one or more identified memory units, in accordance with some embodiments of the present disclosure.

At block 206, the processing logic can augment the set of target memory units with additional target memory units related to the target memory units selected at block 204. An example 300 is provided in FIG. 3 for selecting additional target pages related to a previously selected target page. In example 300, page 302 has been selected as a target memory unit. The processing logic can also select pages 304 paired with the target page (pages in the same word line) and/or pages neighboring the target page (e.g. pages in the same stack 310 in the word lines above 306 and/or below 308 the word line of the previously selected page). In some implementations, the processing logic does not select any additional target memory units and instead proceeds with only the target memory units identified at block 204.

At block 208, the processing logic can generate one or more profiles for the target memory units. In some implementations, the processing logic can generate a profile for each memory unit in the target set of memory units, including any memory units added to the target set at block 206. In various implementations, generating a profile can include computing voltage threshold (vt) distributions, performing an Auto Read Calibration (ARC) analysis, performing a Continuous Read Level Calibration (cRLC) analysis (which can include obtaining DiffEC metrics), logging metrics of the memory unit, or any combination thereof.

Figure 4A:
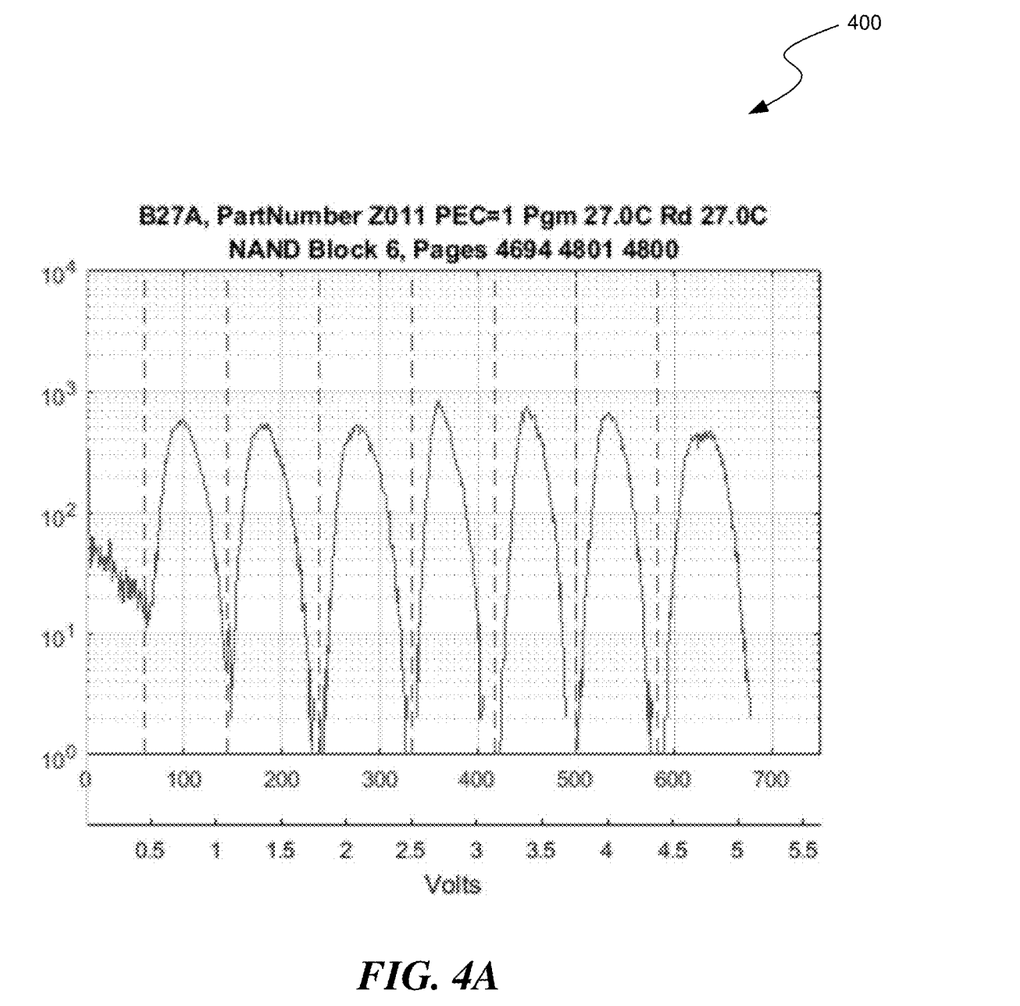
FIG. 4A is a conceptual diagram of profiling a memory unit with a voltage distribution, in accordance with some embodiments of the present disclosure.

Voltage threshold analyses can identify aspects the voltages needed to do read operations (read threshold voltages) for particular areas of memory. The processing logic can compute a distribution for these voltages in the areas of memory that are part of the target memory unit. The processing logic can perform various types of voltage threshold distributions analyses, such as conditional or unconditional voltage threshold distributions analyses. A conditional voltage threshold distributions analysis can be performed when the data stored by the memory unit is known. In these cases, the system knows how the memory unit would ideally be storing the known data and compare that to the actual distribution of the stored data. In an unconditional voltage threshold distribution, the data stored by the memory unit may not be known, however the processing logic can read the memory unit at various voltages (e.g. sweeping a voltage across a range while reading the memory unit). An example 400 is provided in FIG. 4A of data results from sweeping a voltage across a NAND block, in a voltage a range of zero to five volts, which produces output from the NAND block. Results of the read can provide indications of where (e.g. a voltage level) each bit in the target memory unit resides. In example 400, the vertical dashed lines indicates identified valleys corresponding to portions of encoded page values. These results can be described in terms of a histogram across the target memory unit, which can be converted into a distribution.

Figure 4B:
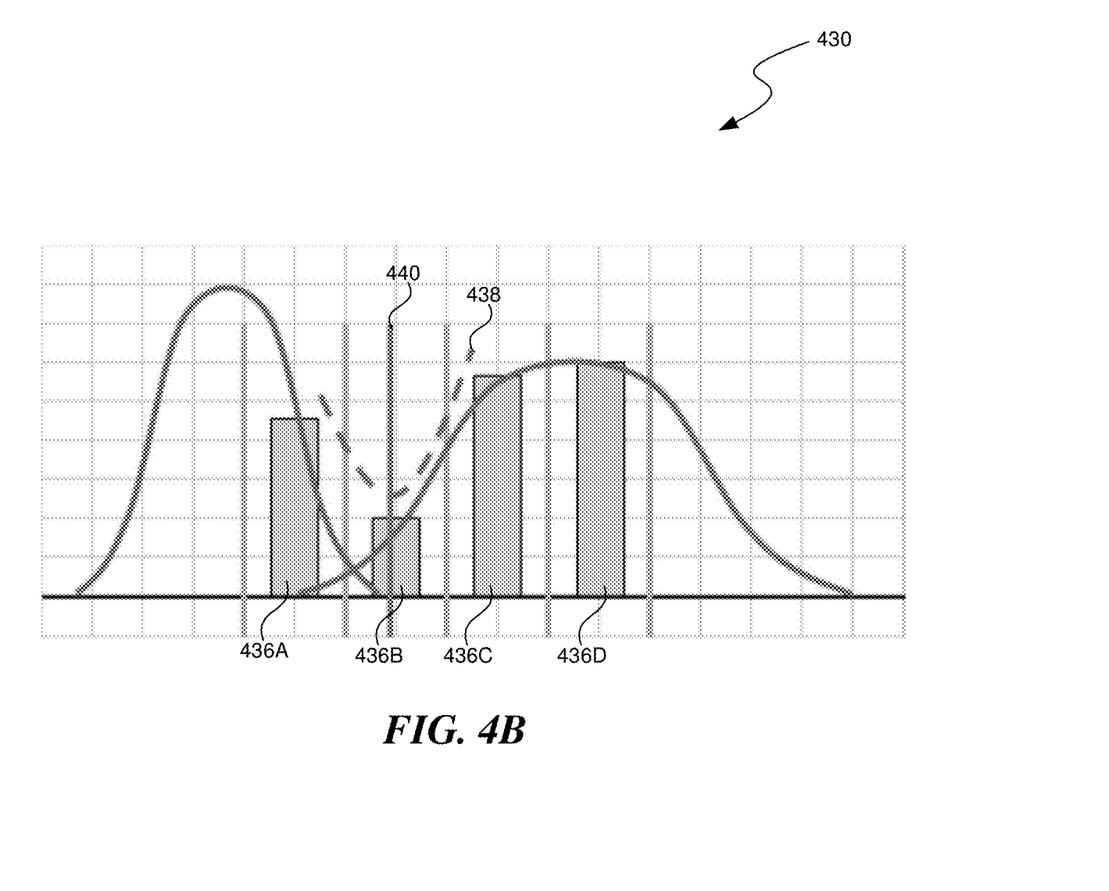
FIG. 4B is a conceptual diagram of profiling a memory unit with an Auto Retry Calibration (ARC) procedure, in accordance with some embodiments of the present disclosure.

The processing logic can perform an ARC analysis by first performing a read operation using an initial read threshold voltage (e.g. a previously calibrated read voltage threshold, such as calibrated threshold 536 in FIG. 4B). The processing logic can then iterate through multiple additional read operations, using successively larger and smaller read voltages. Results of the multiple reads can be used to generate a histogram, e.g. bars 436A-D in FIG. 4B. The processing logic can interpolate a new read threshold based on the results from the multiple reads. For example, the histogram can be converted into a curve (e.g. curve 438) fitted to the heights of the histogram bars (e.g. bars 436A-D). The processing logic can identify the new read threshold (e.g. at new read threshold 440) at the lowest point on the fitted curve. The processing logic can include in the profile of the memory unit the new read thresholds determined or shift directions and shift magnitudes from the previously calibrated read thresholds.

Figure 4C:
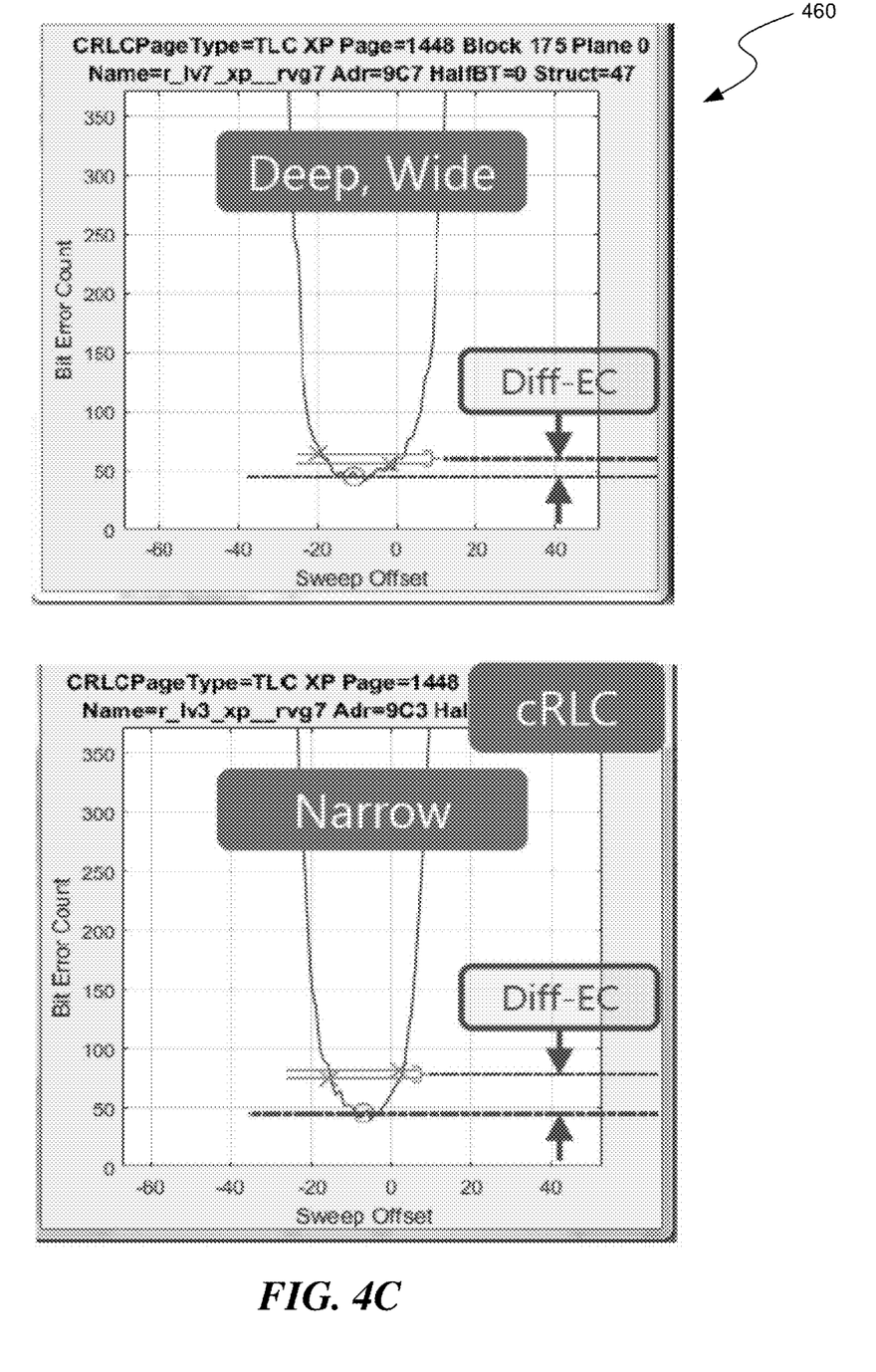
FIG. 4C is a conceptual diagram of profiling a memory unit with an Continuous Read Level Calibration (cRLC) procedure, in accordance with some embodiments of the present disclosure.

The processing logic can perform a cRLC analysis by executing a set number of read operations (e.g. three) for each initial read voltage threshold (i.e. "valley") of a memory unit. This set of reads can be performed in relation to each of a set expected valley positions of the memory unit (e.g. a page), where each expected valley corresponds to a previously calibrated read voltage threshold for the portion of the memory unit. The processing logic can perform each read operation beginning at a different initial read voltage threshold. Based on bit error counts occurring for each read operation, the processing logic can determine if a better result is achieved by shifting the initial read voltage threshold.

The process of performing read sets and selecting an improved initial read voltage threshold can be repeated until convergence occurs, which can be the cRLC result. In some implementations, convergence will be considered reached when the shift amount and shift direction identified has not changed above a threshold amount from the previous iteration for the current valley, or when the variance among a most recent specified number of iterations (e.g. two iterations), for the current valley, is below a threshold amount. The processing logic can include, in the profile of the memory unit, the new read threshold or a shift direction and shift magnitude from the previously calibrated read threshold.

The profile resulting from the cRLC analysis can also include difference error count (DiffEC) results. DiffEC results can provide a characterization of a valley corresponding to an initial read voltage threshold, which can include a depth and width of the valley and/or a distance, on the y-axis, between A) the average, on the y-axis, of the furthest left and furthest right of the read results and B) the y-axis value of the middle of the read results. Examples of characterizations resulting from a cRLC procedure are shown in FIG. 4C.

In various implementations, the target memory unit profile can include any combination of one or more of the above described voltage threshold distributions, ARC results, cRLC results, or DiffEC results. In addition or alternatively, the target memory unit profile can include one or more additional metrics for the target memory units, such as total operation count, erase operation count, read operation count, associated memory unit temperature, power on hours, etc.

In some implementations, the profiles generated at block 208 can be generated during the runtime of the memory device. A profile generated during a memory device runtime means that the data relevant to the triggering event, that initiated creating the profile, is still resident in the memory device. For example, this can include retrieving information about a memory unit before it is erased (e.g. for retirement). As another example, this can include taking temperature measurements within a threshold amount of time from the triggering event, e.g. before the temperature is likely to change a significant amount. As a further example, this can include retrieving data for profiling prior to the memory device experiencing a power cycle.

At block 210, the processing logic can store or utilize the profile(s) generated at block 208. In some implementations, the profile can be stored in association with the memory unit(s) for which the profiles were created. This facilitates later-date analysis of data that was gathered during the runtime of the memory device. In some implementations, the profiles resulting from multiple different trigger conditions can be stored, accumulating memory device profiles for later analysis. Stored profiles can be used to adjust operational parameters of the memory unit and/or for other memory elements of the memory device. Because the profile can be generated during the runtime of the memory device, the adjustments can be performed in real-time, e.g. immediately following a profile trigger event, when the changes are likely to be most effective. As used herein, "real-time" refers to within a set amount of time or before a corresponding action occurs. For example, adjustments in real-time can mean the adjustment occurs within a threshold amount of time from the triggering event or before a subsequent particular event, such as completing a relocation event, occurs. In some implementations, a mapping of profiles or characteristics in profiles can be used to select which actions to take. For example, one mapping can specify that if the ARC results show an average initial read voltage threshold shift of at least 0.15 volts across the target memory unit, then the voltage change for retrying a read in error recover should be decreased by 0.05 volts. In some implementations, the mappings can apply to sets of profiles. For example, the mapping can specify that if at least a threshold number of profiles exhibit a particular characteristic (e.g. above a specified valley width) then the background scanning frequency should be increased.

Figure 5:
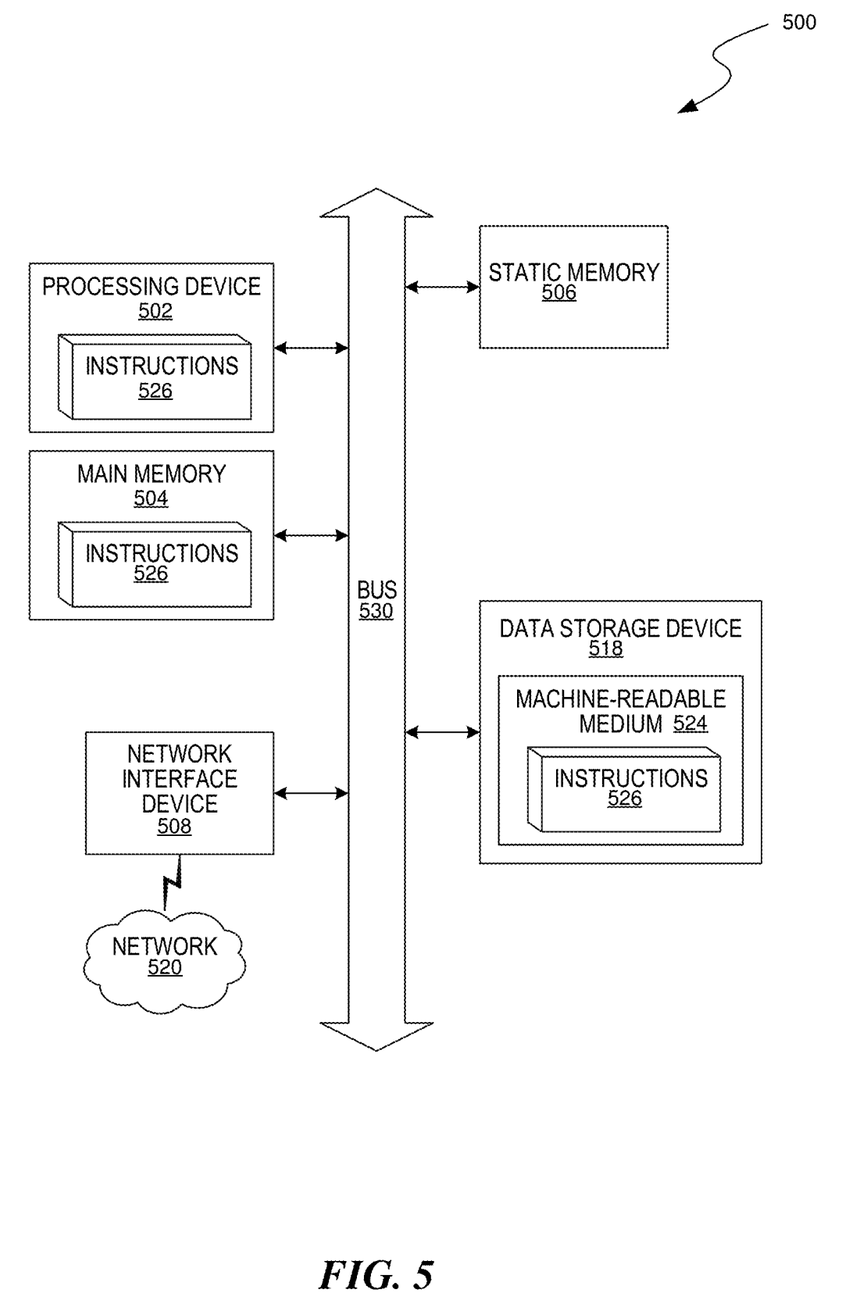
FIG. 5 is a block diagram of an example computer system in accordance with some embodiments of the present disclosure.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory profiling system 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a profiling component (e.g., the memory profiling system 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-5 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Although the subject matter has been described in language specific to structural features and/or methodological acts, it is to be understood that the subject matter defined in the appended claims is not necessarily limited to the specific features or acts described above. Specific embodiments and implementations have been described herein for purposes of illustration, but various modifications can be made without deviating from the scope of the embodiments and implementations. The specific features and acts described above are disclosed as example forms of implementing the claims that follow. Accordingly, the embodiments and implementations are not limited except as by the appended claims.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

We claim:

1. A method comprising:
   determining that a first memory page of a memory device has satisfied a trigger condition;
   generating, during runtime of the memory device, profiles for the first memory page and for one or more second memory pages that did not satisfy the trigger condition; and
   storing the generated profiles,
   wherein the one or more second memory pages comprise:
      at least one second memory page in a same word line as the first memory page; and
      at least one second memory page that is in a word line of the memory block immediately above or immediately below the same word line.

2. The method of claim 1,
   wherein the trigger condition comprises an identification that the first memory page entered error recovery.

3. The method of claim 1,
   wherein the memory device uses a sequence comprising multiple stages in error recovery for memory pages;
   wherein the trigger condition comprises an identification that the first memory page reached at least a threshold stage in the error recovery sequence.

4. The method of claim 1,
   wherein the trigger condition comprises an identification that the first memory page has been selected for retirement.

5. The method of claim 1,
   wherein the memory device uses a background scanning procedure; and
   wherein the trigger condition comprises an identification that a dynamically configured background scan interval has been set above a threshold level.

6. The method of claim 1, further comprising utilizing the stored profiles to adjust, in real-time, operating parameters of the memory device.

7. The method of claim 1, wherein the memory device comprises negative-and (NAND) memory components.

8. The method of claim 1, wherein generating the profiles comprises computing a voltage threshold (vt) distribution for each of the first memory page and the one or more second memory pages.

9. The method of claim 1, wherein generating the profiles comprises performing an Auto Read Calibration (ARC) analysis for each of the first memory page and the one or more second memory pages.

10. The method of claim 1, wherein generating the profiles comprises performing a Continuous Read Level Calibration (cRLC) analysis for each of the first memory page and the one or more second memory pages.

11. The method of claim 1, wherein generating the profiles comprises logging metrics for each of the first memory page and the one or more second memory pages, the metrics comprising one or more of: total operation count, erase operation count, read operation count, associated temperature, power on hours, or any combination thereof.

12. The method of claim 1 further comprising acting on the stored profiles by adjusting operating parameters of the memory device, wherein adjusting the operating parameters comprises:
   accessing a mapping of profile characteristics to actions;
   using at least one of the profiles as a key, in the mapping, to identify an action specifying the adjustments to the operating parameters; and
   implementing the action by making the adjustments to the operating parameters.

13. A non-transitory computer-readable storage medium comprising instructions that, when executed by one or more processing devices, cause the one or more processing devices to:
   determine that a first memory page of a memory device has satisfied a trigger condition;
   generate, during runtime of the memory device, profiles for the first memory page and for one or more second memory pages that did not satisfy the trigger condition; and
   store the generated profiles,
   wherein the one or more second memory pages comprise:
      at least one second memory page in a same word line as the first memory page; and
      at least one second memory page that is in a word line of the memory block immediately above or immediately below the same word line.

14. The computer-readable storage medium of claim 13,
   wherein the memory device uses a sequence comprising multiple stages in error recovery for memory pages;
   wherein the trigger condition comprises an identification that the first memory page reached at least a threshold stage in the error recovery sequence.

15. The computer-readable storage medium of claim 13,
   wherein the trigger condition comprises one of:
      an identification that the first memory page has been selected for retirement;
      an identification that a dynamically configured background scan interval has been set above a threshold level; or
      an identification that a background scan generated a quality measure for the first memory page below a threshold.

16. The computer-readable storage medium of claim 2, wherein generating the profiles comprises:
   computing a voltage threshold (vt) distribution for each of the first memory page and the one or more second memory pages;
   performing an Auto Read Calibration (ARC) analysis for each of the first memory page and the one or more second memory pages;
   performing a Continuous Read Level Calibration (cRLC) analysis for each of the first memory page and the one or more second memory pages; or
   any combination thereof.

17. A system comprising:
   a memory; and
   one or more processors that perform operations comprising:
      determining that a first memory page of a memory device has satisfied a trigger condition;

generating, during runtime of the memory device, profiles for the first memory page and for one or more second memory pages that did not satisfy the trigger condition; and storing the generated profiles, wherein the one or more second memory pages comprise:
- at least one second memory page in a same word line as the first memory page; and
- at least one second memory page that is in a word line of the memory block immediately above or immediately below the same word line.

18. The system of claim 17, wherein the operations further comprise adjusting operating parameters of the memory device, based on the stored profiles, by:

accessing a mapping of profile characteristics to actions;

using at least one of the stored profiles as a key, in the mapping, to identify an action specifying the adjustments to the operating parameters; and implementing the action by making the adjustments to the operating parameters.

19. The system of claim 17, wherein the trigger condition comprises one of:
- an identification that the first memory page reached at least a threshold stage in a multi-stage error recovery sequence;
- an identification that the first memory page has been selected for retirement;
- an identification that a dynamically configured background scan interval has been set above a threshold level; or
- an identification that a background scan generated a quality measure for the first memory page below a threshold.

20. The system of claim 17, wherein generating the profiles comprises:

computing a voltage threshold (vt) distribution for each of the first memory page and the one or more second memory pages;

performing an Auto Read Calibration (ARC) analysis for each of the first memory page and the one or more second memory pages;

performing a Continuous Read Level Calibration (cRLC) analysis for each of the first memory page and the one or more second memory pages; or any combination thereof.

* * * * *